(12) United States Patent
Yang

(10) Patent No.: US 12,085,123 B2
(45) Date of Patent: Sep. 10, 2024

(54) HINGE ASSEMBLY AND ELECTRONIC DEVICE

(71) Applicant: Beijing Xiaomi Mobile Software Co., Ltd., Beijing (CN)

(72) Inventor: Jieming Yang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 258 days.

(21) Appl. No.: 17/681,394

(22) Filed: Feb. 25, 2022

(65) Prior Publication Data

US 2023/0047119 A1 Feb. 16, 2023

(30) Foreign Application Priority Data

Aug. 12, 2021 (CN) .......................... 202110926287.0

(51) Int. Cl.
*F16C 11/04* (2006.01)
*G06F 1/16* (2006.01)
(Continued)

(52) U.S. Cl.
CPC ............ *F16C 11/04* (2013.01); *G06F 1/1679* (2013.01); *G06F 1/1681* (2013.01);
(Continued)

(58) Field of Classification Search
CPC ...... F16C 11/04; G06F 1/1679; G06F 1/1681; H05K 5/0226; E05D 3/18; E05D 11/1007; E05Y 2201/22; E05Y 2900/606
See application file for complete search history.

(56) References Cited

U.S. PATENT DOCUMENTS

2019/0250676 A1* 8/2019 Lin ...................... G06F 1/1616
2022/0377919 A1* 11/2022 Zhang .................. H05K 5/0226
(Continued)

FOREIGN PATENT DOCUMENTS

CN 112128216 A 12/2020
EP 3355157 A1 8/2018
WO 2021/115462 A1 6/2021

OTHER PUBLICATIONS

Extended European Search Report dated Aug. 11, 2022 for European Patent Application No. 22158623.3.

*Primary Examiner* — Christine M Mills
*Assistant Examiner* — Matthew J Sullivan
(74) *Attorney, Agent, or Firm* — Volpe Koenig

(57) ABSTRACT

A hinge assembly includes: a fixed supporting piece; a rotating assembly, movably connected with the fixed supporting piece and including a first limiting portion; and a locking mechanism, disposed on the fixed supporting piece and including a limiting piece which includes a second limiting portion matched with the first limiting portion. The fixed supporting piece slides relative to the rotating assembly in a direction perpendicular to an axial direction of the rotating assembly in a rotation process of the rotating assembly, so that the first limiting portion is connected with the second limiting portion or the first limiting portion is separated from the second limiting portion; when the first limiting portion is connected with the second limiting portion, the two limiting portions are matched with each other to limit rotation of the rotating assembly; when separated, limiting of the rotating assembly is released.

19 Claims, 8 Drawing Sheets

(51) Int. Cl.
*H05K 5/02* (2006.01)
*E05D 3/18* (2006.01)
*E05D 11/10* (2006.01)

(52) U.S. Cl.
CPC ............ *H05K 5/0226* (2013.01); *E05D 3/18* (2013.01); *E05D 11/1007* (2013.01); *E05Y 2201/22* (2013.01); *E05Y 2999/00* (2024.05)

(56) References Cited

U.S. PATENT DOCUMENTS

| | | | |
|---|---|---|---|
| 2022/0413562 A1* | 12/2022 | Kim | H04M 1/0216 |
| 2023/0076291 A1* | 3/2023 | Yun | H04M 1/022 |
| 2023/0176629 A1* | 6/2023 | Cho | G06F 1/1652 |
| | | | 361/679.27 |
| 2023/0353665 A1* | 11/2023 | Han | F16C 11/04 |
| 2023/0393632 A1* | 12/2023 | Hong | H04M 1/02 |
| 2023/0407906 A1* | 12/2023 | Okada | F16C 1/10 |
| 2023/0418339 A1* | 12/2023 | Bai | F16C 11/04 |

\* cited by examiner

HINGE ASSEMBLY AND ELECTRONIC DEVICE

CROSS REFERENCE TO RELATED APPLICATION

The present application claims the benefit of priority to Chinese Application No. 202110926287.0 filed on Aug. 12, 2021, the contents of which are incorporated herein by reference in their entireties for all purposes.

BACKGROUND

With the development of a flexible OLED display screen technology and the fact that a foldable electronic device has both the portability of an ordinary electronic device and the ultimate experience of large-screen display after unfolding, the foldable electronic device has gradually become an important trend in the development of mobile terminals, and has become an important field of competition for major terminal manufacturers.

The current state switching of the foldable electronic device mainly relies on a hinge assembly, and the electronic device is driven to be folded and unfolded through folding and unfolding of the hinge assembly.

SUMMARY

The disclosure relates to the technical field of terminals, and relates to a hinge assembly and an electronic device.

According to a first aspect of examples of the disclosure, a hinge assembly is provided, and includes:
  a fixed supporting piece;
  a rotating assembly, movably connected with the fixed supporting piece and including a first limiting portion; and
  a locking mechanism, disposed on the fixed supporting piece and including a limiting piece which includes a second limiting portion matched with the first limiting portion.

The fixed supporting piece slides relative to the rotating assembly in a direction perpendicular to an axial direction of the rotating assembly in a rotation process of the rotating assembly, so that the first limiting portion is connected with the second limiting portion or the first limiting portion is separated from the second limiting portion; when the first limiting portion is connected with the second limiting portion, the first limiting portion and the second limiting portion are matched with each other to limit rotation of the rotating assembly; and when the first limiting portion is separated from the second limiting portion, limiting of the rotating assembly is released.

According to a second aspect of examples of the disclosure, an electronic device is provided, and includes:
  a shell; and
  a hinge assembly, including:
    a fixed supporting piece;
    a rotating assembly, movably connected with the fixed supporting piece and comprising a first limiting portion; and
    a locking mechanism, the locking mechanism is on the fixed supporting piece and comprising a limiting piece which comprises a second limiting portion matched with the first limiting portion.

The fixed supporting piece slides relative to the rotating assembly in a direction perpendicular to an axial direction of the rotating assembly in a rotation process of the rotating assembly, so that the first limiting portion is connected with the second limiting portion or the first limiting portion is separated from the second limiting portion; when the first limiting portion is connected with the second limiting portion, the first limiting portion and the second limiting portion are matched with each other to limit rotation of the rotating assembly; and when the first limiting portion is separated from the second limiting portion, limiting of the rotating assembly is released.

The fixed supporting piece is connected to the shell so as to drive the shell to rotate.

It should be understood that the above general descriptions and the following detailed descriptions are exemplary and explanatory only, and are not intended to limit the disclosure.

BRIEF DESCRIPTION OF THE DRAWINGS

The accompanying drawings, which are incorporated in and constitute a part of this specification, illustrate examples consistent with the disclosure and together with the specification serve to explain the principles of the disclosure.

DETAILED DESCRIPTION

Examples will be described in detail herein, examples of which are illustrated in the accompanying drawings. When the following description refers to the accompanying drawings, the same numbers in different drawings represent the same or similar elements unless otherwise indicated. The implementations described in the following examples do not represent all implementations consistent with the disclosure. On the contrary, they are merely examples of an apparatus and a method consistent with some aspects of the disclosure as detailed in the appended claims.

The terms used in the disclosure are for the purpose of describing particular examples only and are not intended to limit the disclosure. As used in the disclosure and the appended claims, the singular forms "a", "the" and "this" are intended to include the plural forms as well, unless the context clearly dictates otherwise. It will also be understood that the term "and/or" as used herein refers to and includes any or all possible combinations of one or more associated listed items.

It should be understood that although the terms first, second, third, etc. may be used in the disclosure to describe various information, such information should not be limited by these terms. These terms are only used to distinguish the same type of information from each other. For example, first information may also be referred to as second information, and similarly, the second information may also be referred to as first information, without departing from the scope of the disclosure. Depending on the context, the word "if" as used herein may be interpreted as "at the time of" or "when" or "in response to determining".

Figure 1:
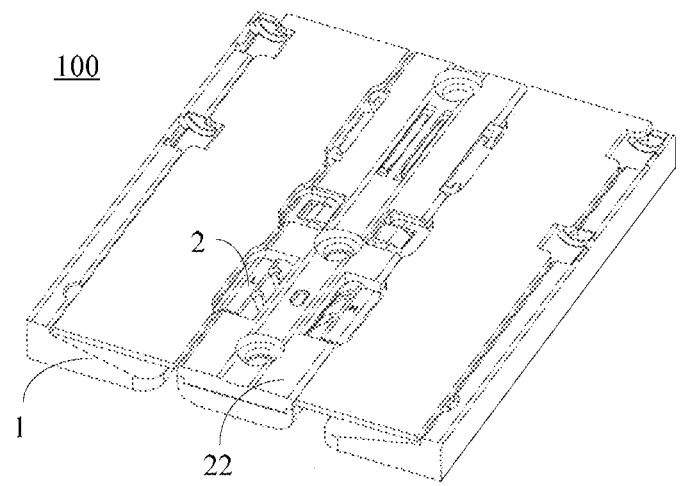
FIG. 1 is a schematic structural diagram of a hinge assembly in an unfolded state illustrated according to an embodiment of the disclosure.
Figure 2:
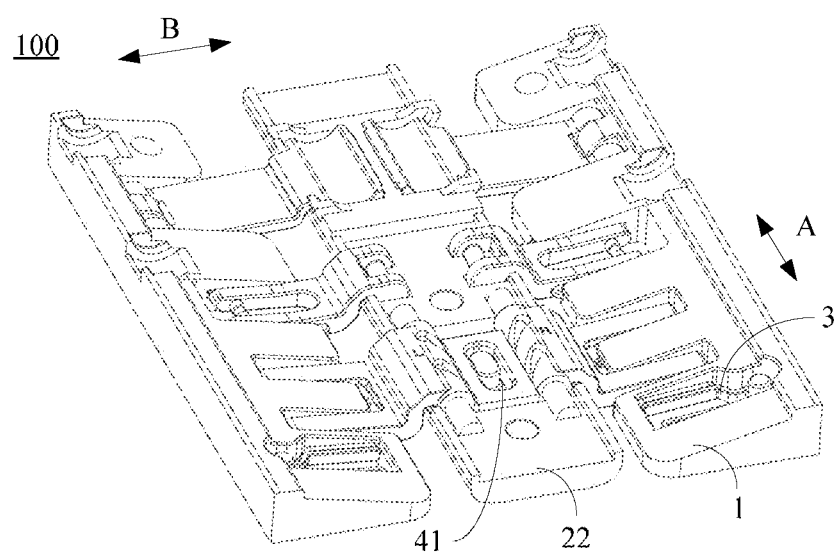
FIG. 2 is a schematic diagram of a partial structure of the hinge assembly in FIG. 1.
Figure 3:
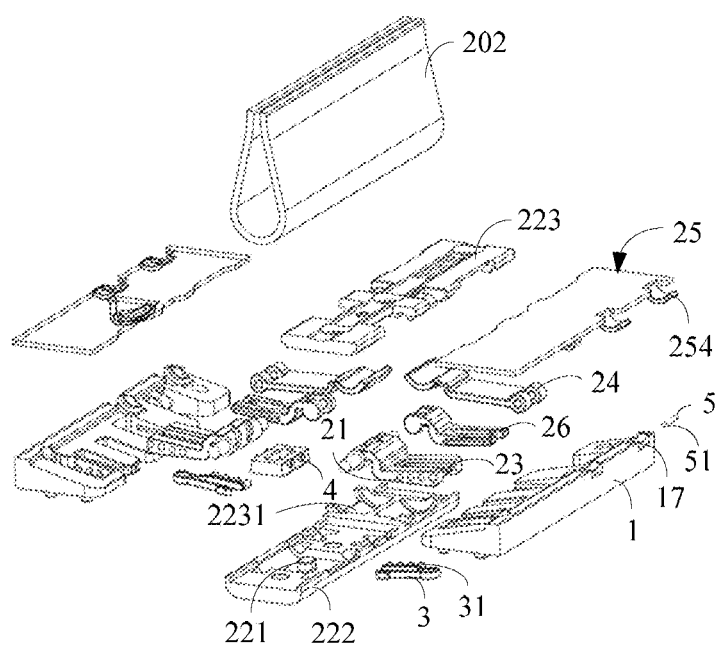
FIG. 3 is an exploded schematic diagram of a hinge assembly illustrated according to an embodiment of the disclosure.
Figure 4:
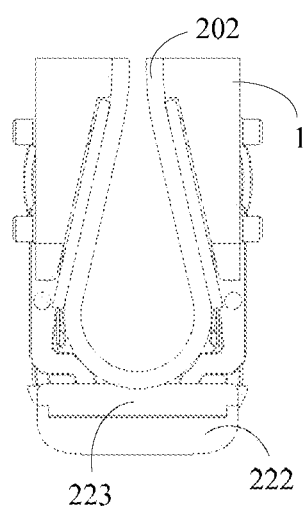
FIG. 4 is a schematic structural diagram of a hinge assembly in a folded state illustrated according to an embodiment of the disclosure.
Figure 5:
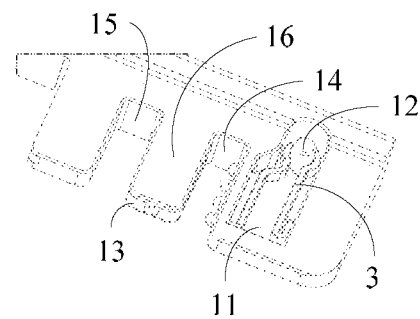
FIG. 5 is a partial schematic diagram of a hinge assembly illustrated according to an embodiment of the disclosure.
Figure 6:
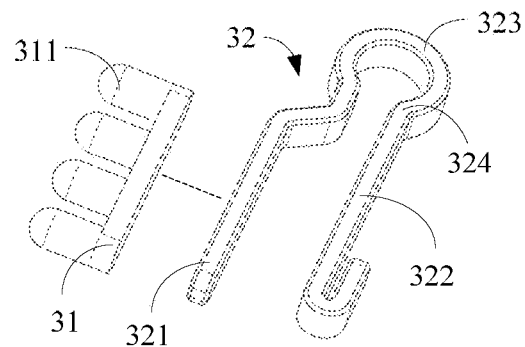
FIG. 6 is an exploded schematic diagram of a locking mechanism illustrated according to an embodiment of the disclosure.

FIG. 1 is a schematic structural diagram of a hinge assembly 100 in an unfolded state illustrated according to an embodiment of the disclosure. FIG. 2 is a schematic diagram of a partial structure of the hinge assembly 100 in FIG. 1. FIG. 3 is an exploded schematic diagram of a hinge assembly 100 illustrated according to an embodiment of the disclosure. FIG. 4 is a schematic structural diagram of a hinge assembly 100 in a folded state illustrated according to an embodiment of the disclosure. FIG. 5 is a partial schematic diagram of a hinge assembly 100 illustrated according to an embodiment of the disclosure. FIG. 6 is an exploded schematic diagram of a locking mechanism 3 illustrated according to an embodiment of the disclosure. As shown in FIG. 1-FIG. 6, the hinge assembly 100 may include fixed supporting pieces 1, a rotating assembly 2 and locking mechanisms 3. The rotating assembly 2 may include first limiting portions 21 and is movably connected with the fixed supporting pieces 1, and when the rotating assembly 2 rotates in an axial direction of the rotating assembly 2 (i.e., a direction shown by an arrow A in FIG. 2), a state of the hinge assembly 100 may be switched, and the fixed supporting pieces 1 may be pushed to slide relative to the rotating assembly 2 in a direction perpendicular to the axial direction of the rotating assembly 2, that is, when the rotating assembly 2 rotates, the fixed supporting pieces 1 may be pushed to slide in the direction indicated by an arrow B in FIG. 2. FIG. 2 further shows a base body 22 and a second guide groove 41.

As shown in FIG. 5 and FIG. 6, the locking mechanism 3 may be disposed on the fixed supporting piece 1, the locking mechanism 3 may include a limiting piece 31, and the limiting piece 31 may include second limiting portions 311. Since the locking mechanism 3 is disposed on the fixed supporting piece 1, when the rotating assembly 2 rotates, the locking mechanism 3 may move synchronously with the fixed supporting piece 1, so that the locking mechanism 3 may also move relative to the rotating assembly 2 in the direction indicated by the arrow B FIG. 2, and in the process of generating relative movement between the rotating assembly 2 and the locking mechanism 3, the first limiting portions 21 and the second limiting portions 311 may be connected or separated. When the first limiting portions 21 and the second limiting portions 311 are connected, the first limiting portions 21 and the second limiting portions 311 may be matched to limit the rotation of the rotating assembly 2, so that the hinge assembly 100 may be maintained in a current state, for example, it may be maintained in an unfolded state or a folded state or in any bending state between the unfolded state and the folded state; and when the first limiting portions 21 and the second limiting portions 311 are separated, limiting of the rotating assembly 2 is released, and under the action of an external acting force, the rotating assembly 2 may continue to rotate to switch the current state of the hinge assembly 100.

Based on this, through a movement relation between the rotating assembly 2, the fixed supporting pieces 1 and the locking mechanisms 3, the relative movement may be generated between the rotating assembly 2 and the locking mechanisms 3, the first limiting portions 21 and the second limiting portions 311 may be connected or separated, and the rotation of the rotating assembly 2 may be limited by matching between the first limiting portions 21 and the second limiting portions 311, so that the hinge assembly 100 is maintained at a target position, and the state of the hinge assembly 100 may be switched when the first limiting portions 21 and the second limiting portions 311 are separated, so that when the hinge assembly 100 is applied to a foldable electronic device, the foldable electronic device may be maintained in a target bending state, and folding methods of the foldable electronic device are enriched.

In the example provided by the disclosure, the first limiting portions 21 include concave portions disposed side by side in the direction perpendicular to the axial direction of the rotating assembly 2, and the second limiting portions 311 include a plurality of convex blocks disposed side by side in an axial direction of first rotating portions 231. During the rotation of the rotating assembly 2, the fixed supporting pieces 1 slide in the direction perpendicular to the axial direction of the rotating assembly 2, so that the rotating assembly 2 may be limited when the convex blocks are at least partially located in the concave portions. Under the action of the external acting force, fixed supporting pieces 1 are driven to continue to slide, and the convex blocks may slide out from the current concave portions to release the limiting, as the rotating assembly 2 continues to rotate, the convex blocks may be matched into another concave portion, and at the moment the hinge assembly 100 may be limited to another angle. That is, when the same concave portion is matched with different convex blocks for limiting, the rotating assembly 2 may be limited to different angles, so that the hinge assembly 100 may be limited at different target bending positions.

The more the quantity of the concave portions and the convex blocks, the more angles that may limit the rotating assembly 2, the more the hovering states of the hinge assembly 100, and at the same time, a plurality of groups of concave portions and the convex blocks that are matched with each other can improve the stability of limiting the first rotating portions 231 to the target angle. In some other examples, the first limiting portion 21 may also include a single concave portion, and the second limiting portion 311 includes a plurality of convex blocks, so that the multi-angle limiting of the rotating assembly 2 can also be realized; or, the first limiting portion 21 may also include a plurality of concave portions, and the second limiting portion 311 includes a single convex block, so that the multi-angle limiting of the rotating assembly 2 can also be realized; or, in some other examples, in the case where the requirements for the limiting angle of the rotating assembly 2 are not high, the first limiting portion 21 may also include a single concave portion, and the second limiting portion 311 may include a single convex block, so that single-angle limiting of the rotating assembly 2 can be realized.

Figure 7:
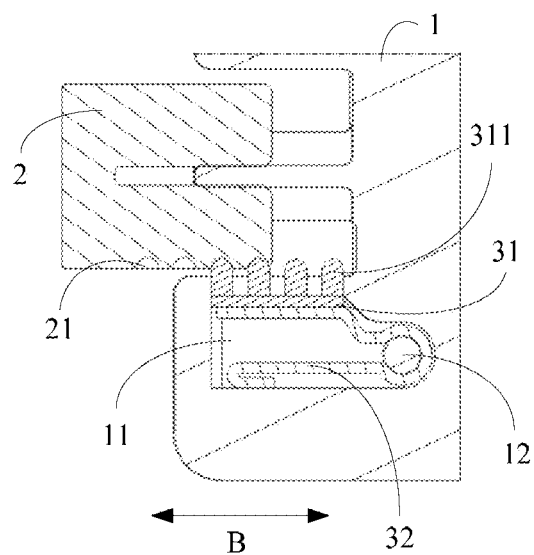
FIG. 7 is a locking state of a hinge assembly illustrated according to an embodiment of the disclosure.
Figure 8:
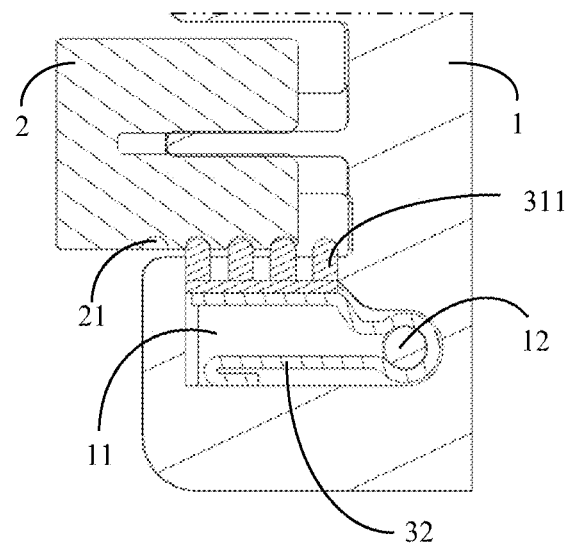
FIG. 8 is another locking state of a hinge assembly illustrated according to an embodiment of the disclosure.
Figure 9:
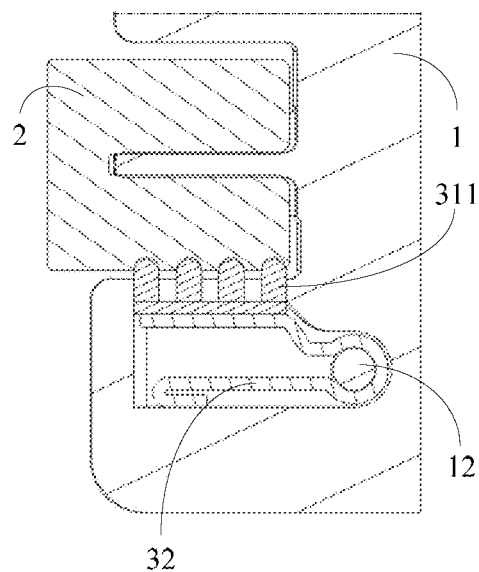
FIG. 9 is yet another locking state of a hinge assembly illustrated according to an embodiment of the disclosure.

The specific movement process is described in the disclosure by taking the hinge assembly 100 switching from the unfolded state to the folded state as an example. As shown in FIG. 7, the hinge assembly 100 is in the unfolded state at this time, two convex blocks of the limiting piece 31 in a direction from left to right in FIG. 7 are matched with the corresponding concave portions on the rotating assembly 2, and the hinge assembly 100 is limited in the unfolded state; with the rotation of the rotating assembly 2, the fixed supporting piece 1 and the rotating assembly 2 slide relative to each other in the direction perpendicular to the axial direction of the rotating assembly 2, that is, in the direction indicated by the arrow B, the convex blocks and the concave portions that are matched with each other are disengaged in FIG. 7, the hinge assembly 100 is bent to be in a state shown in FIG. 8, at this time, three convex blocks of the limiting piece 31 in a direction from left to right in FIG. 8 are matched with the corresponding concave portions on the rotating assembly 2, and at this time, the hinge assembly 100 may be limited at a position of being by 120°; and as the rotating assembly 2 rotates again, the fixed supporting piece 1 and the rotating assembly 2 slide relative to each other in the direction perpendicular to the axial direction of the rotating assembly 2, that is, in the direction indicated by the arrow B, the convex blocks and the concave portions that are matched with each other are disengaged in FIG. 8, the hinge assembly 100 is folded to be in a state shown in FIG. 9, four convex blocks of the limiting piece 31 in the direction from left to right in FIG. 8 are matched with the corresponding concave portions on the rotating assembly 2, and at this time, the hinge assembly 100 may be limited in the folded state. Similarly, the switching process of the hinge assembly 100 from the folded state to the unfolded state may refer to a relative movement sequence of FIG. 9, FIG. 8 and FIG. 7.

It should be noted that, in the example provided by the disclosure, the first limiting portions 21 including the concave portions and the second limiting portions 311 including the convex blocks are taken as an example for illustration. In other examples, the first limiting portions 21 may include convex blocks, and the second limiting portions 311 may include concave portions, and the quantity of the concave portions and the convex blocks may refer to the example provided in the disclosure, which is not limited in the disclosure. In still other examples, one of the first limiting portions 21 or the second limiting portions 311 may also include hooks, and the other one includes hook grooves, and limiting is realized through matching of the hooks and the hook grooves. The first limiting portions 21 and the second limiting portions 311 may also include other structures configured to be matched for limiting, which will not be repeated herein.

Specifically, in the example provided by the disclosure, in order to improve the hand feeling in the process of folding or unfolding the hinge assembly 100, the locking mechanisms 3 may further include elastic pieces 32, one ends of the elastic pieces 32 are connected with or abut against the fixed supporting pieces 1, the other ends may be connected with the limiting pieces 31, and a deformation direction of the elastic pieces 32 is parallel to the axial direction of the rotating assembly 2, so that during the relative sliding of the fixed supporting pieces 1 and the rotating assembly 2, when the convex blocks and the concave portions are in a separated state, a plane of the rotating assembly 2 may abut and press the convex blocks of the limiting pieces 31, and the elastic pieces 32 are compressed. Additionally, at the moment when the convex blocks and the concave portions are about to be matched with each other, due to gaps provided by the concave portions, the elastic pieces may be reset, so that the convex blocks are pushed into the concave portions to realize the limiting.

The elastic pieces 32 may include compression springs, one ends of the compression springs may be connected with the limiting pieces 31, and the other ends may be connected with the fixed supporting pieces 1. Or, the fixed supporting pieces 1 include accommodating grooves 11 and first rotating shafts 12 located in the accommodating grooves 11. As shown in FIG. 6, the elastic piece 32 may include a first elastic arm 321, a second elastic arm 322 and a first connecting portion 323, the first connecting portion 323 connects the first elastic arm 321 with the second elastic arm 322, the first connecting portion 323 may be disposed around the first rotating shaft 12, the first elastic arm 321 is connected with the limiting piece 31, the second limiting portions 311 are disposed by protruding through a first inner wall of the accommodating groove 11, the second elastic arm 322 abuts against a second inner wall of the accommodating groove 11 opposite to the first inner wall, and an elastic gap is disposed between the first elastic arm 321 and the second elastic arm 322. Based on this, in the sliding process of the rotating assembly 2, the first elastic arms 321 may be deformed and compressed toward the second elastic arms 322, and at the moment when the concave portions and the convex blocks are about to be matched, the first elastic arms 321 are reset, and the convex blocks are pushed into the concave portions to realize the limiting of the rotating assembly 2.

Further, a bent portion 324 may be disposed at a connection position between the first elastic arm 321 and the first connecting portion 323, similarly, a bent portion 324 may also be disposed at a connection position between the second elastic arm 322 and the first connecting portion 323. The bent portions 324 are recessed inward around a radial direction of first rotating shafts 12, thereby reducing a diameter between two ends of the first connecting portion 323, preventing the first rotating shaft from being disengaged from the first connecting portion 323, and improving the stability of the installation of the elastic piece 32. In the example of the disclosure, the bent portions 324 disposed at the connection position between the first elastic arm 321 and the first connecting portion 323 and the connection position between the second elastic arm 322 and the first connecting portion 323 are taken as an example for illustration. In other examples, the bent portion 324 may also be disposed at the connection position between the first elastic arm 321 and the first connecting portion 323 or at the connection position between the second elastic arm 322 and the first connecting portion 323, which is not limited by the disclosure. One end of the second elastic arm 322 away from the first connecting portion 323 is bent toward the second inner wall to abut against the second inner wall, so that a certain gap is left while the second elastic arm 322 is limited, and deformation of the elastic piece 32 is facilitated.

In the above-mentioned example, the limiting pieces 31 and the elastic pieces 32 being connected and matched with the fixed supporting pieces 1 are taken as an example for illustration. In other some examples, the limiting pieces 31 included in the locking mechanism 3 may be directly disposed on the fixed supporting pieces 1, for example, may be disposed in regions where the fixed supporting pieces 1 are slidably connected with the rotating assembly 2.

Further, in the example provided by the disclosure, the rotating assembly 2 may include a base body 22, first pull rods 23 and second pull rods 24, one ends of the first pull rods 23 are rotationally connected with the base body 22, the other ends of the first pull rods 23 are slidably connected with the fixed supporting pieces 1, one ends of the second pull rods 24 are movably connected with the base body 22, the other ends of the second pull rods 24 are rotationally connected with the fixed supporting pieces 1, and the first limiting portions 21 of the rotating assembly 2 are disposed at ends of the first pull rods 23 away from the base body 22. When the second pull rods 24 move relative to the base body 22, the fixed supporting pieces 1 may be driven to rotate relative to the base body 22, and the fixed supporting pieces 1 gets close to or moves away from the base body 22 at the same time. At the same time, relative sliding between the first pull rods 23 and the fixed supporting pieces 1 in the direction perpendicular to the axial direction of the rotating assembly 2 may be generated, so that the relative position relation between the first limiting portions 21 and the second limiting portions 311 can be switched, and can realize state switching and hovering of the hinge assembly 100 at the same time. The axial direction of the rotating assembly 2 may refer to an axial direction when the first pull rods 23 are rotationally connected with the base body 22.

Figure 10:
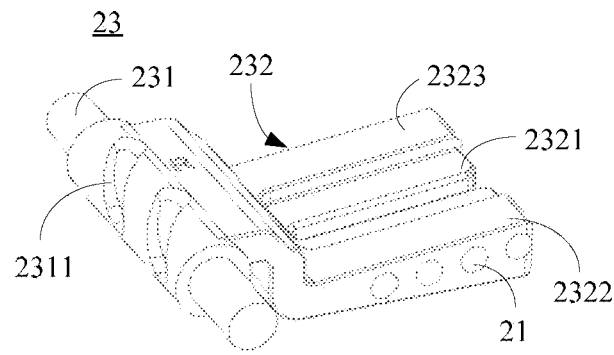
FIG. 10 is a schematic structural diagram of a first pull rod illustrated according to an embodiment of the disclosure.

As shown in FIG. 10, the first pull rod 23 may include the first rotating portion 231 and a first matching portion 232 connected with the first rotating portion 231, the first rotating portion 231 may be rotationally connected with the base body 22, the first matching portion 232 may be slidably connected with the fixed supporting piece 1, and the first limiting portions 21 of the rotating assembly 2 may be disposed on the first matching portion 232. For example, in the example provided by the disclosure, the first matching portion 232 may include a first sliding rail 2321, the fixed supporting piece 1 may include a first sliding groove 13, and through matching between the first sliding rail 2321 and the first sliding groove 13, the sliding connection between the fixed supporting piece 1 and the first matching portion 232 is realized. In some examples, the first sliding groove 13 may be disposed on a surface of the fixed supporting piece 1. In some other examples, the fixed supporting piece 1 may include a groove structure recessed in the direction perpendicular to the axial direction of the rotating assembly 2, and the first matching portion 232 may partially extend into the groove structure and is slidably connected with an inner wall of the groove structure, so as to reduce a thickness of the hinge assembly 100.

For example, in the example provided by the disclosure, in order to reduce the overall thickness of the hinge assembly 100, the first matching portion 232 may include a first subsection 2322 and a second subsection 2323, the first subsection 2322 and the second subsection 2323 are respectively connected with the first rotating portion 231. In the axial direction of the first rotating portion 231, a certain distance is set between the first subsection 2322 and the second subsection 2323, the fixed supporting piece 1 may include a first concave groove 14, a second concave groove 15 and a first extending portion 16, the first extending portion 16 is located between the first concave groove 14 and the second concave groove 15. When the first matching portion 232 is matched with the fixed supporting piece 1, the first subsection 2322 may extend into the first concave groove 14 and is slidably connected with an inner wall of the first concave groove 14, the second subsection 2323 may extend into the second concave groove 15 and is slidably connected with an inner wall of the second concave groove 15, and the first extending portion 16 may be located between the first subsection 2322 and the second subsection 2323. The sliding connection between the first subsection 2322 and the inner wall of the first concave groove 14 may be that as shown in FIG. 5, the first sliding rail 2321 or the first sliding groove 13 is formed in a surface of the first extending portion 16 forming the inner wall of the first concave groove 14. In other examples, the first sliding rail 2321 or the first sliding groove 13 may be formed in the inner wall of the first concave groove 14 opposite to the surface of the first extending portion 16, which is not limited in the disclosure. Similarly, the sliding connection between the second subsection 2323 and the inner wall of the second concave groove 15 may refer to the first subsection 2322, and a sliding connection mode between the second subsection 2323 and the inner wall of the second concave groove 15 and a sliding connection mode between the first subsection 2322 and the inner wall of the first concave groove 14 may be the same or different from each other.

For a structure in which the first matching portion 232 includes the first subsection 2322 and the second subsection 2323, the accommodating groove 11 of the fixed supporting piece 1 may communicate with the first concave groove 14, the locking mechanism 3 is disposed in the accommodating groove 11, and the first limiting portions 21 are disposed on a side surface of the first subsection 2322, for example, the convex blocks or the concave portions may be formed on the side surface of the first subsection 2322 facing the accommodating groove 11. Based on this, when the first subsection 2322 slides relative to the inner wall of the first concave groove 14, the first subsection 2322, the locking mechanism 3 and a support 222 may move relative to each other, so that the position relation between the first limiting portions 21 and the second limiting portions 311 is switched so as to switch the state of the hinge assembly 100. Based on this structural arrangement mode, the integrated arrangement of the overall structure on the fixed supporting piece 1 is facilitated.

Figure 11:
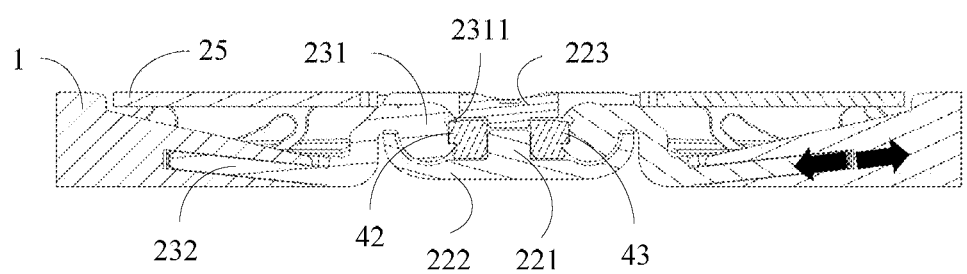
FIG. 11 is a first schematic cross-sectional diagram of a hinge assembly illustrated according to an embodiment of the disclosure.
Figure 12:
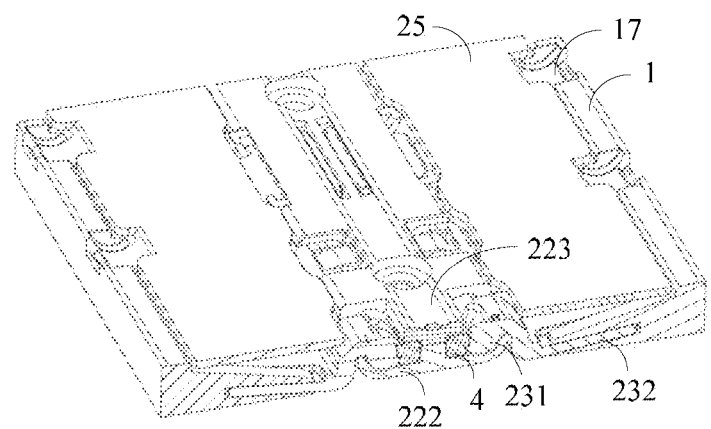
FIG. 12 is a schematic three-dimensional cross-sectional diagram of the hinge assembly in FIG. 11.

It can be understood that, in accordance with the current development trend, the hinge assembly 100 may generally be applied to a foldable electronic device, so in order to synchronously fold screens on both sides of the electronic device, the rotating assembly 2 may include a plurality of first pull rods 23. At least one first pull rod 23 is located on a first side of the base body 22, at least one first pull rod is located on a second side of the base body 22, and the first side and the second side are oppositely disposed. For example, as shown in FIG. 11 and FIG. 12, assuming that the first side is a left side in FIG. 11 and FIG. 12 and the second side is a right side in FIG. 11 and FIG. 12, the plurality of first pull rods 23 may include a left-side first pull rod and a right-side first pull rod, structures of the left-side first pull rod and the right-side first pull rod may be the same. In other words, the left-side first pull rod and the right-side first pull rod may each include the first rotating portion 231 and the first matching portion 232, and a structure of the first matching portion 232 may refer to the structure disclosed in the above example. The first rotating portion 231 may further include first guide grooves 2311 extending obliquely around the axial direction of the first rotating portion 231.

In order to realize the synchronous movement of the left-side first pull rod and the right-side first pull rod, the rotating assembly 2 may also include a sliding block 4, the sliding block 4 may include first protruding portions 42 and second protruding portions 43. The first protruding portions 42 and the second protruding portions 43 are disposed on two opposite surfaces of the sliding block 4, the first protruding portions 42 face the left-side first pull rod. The first protruding portions 42 may extend into the first guide grooves 2311 of the left-side first pull rod. The second protruding portions 43 may face the right-side first pull rod, and the second protruding portions 43 may extend into the first guide grooves 2311 of the right-side first pull rod. Based on this, when the left-side first pull rod rotates relative to the base body 22, the sliding block 4 may be driven to slide along the base body 22 through the first protruding portions 42, and then the right-side first pull rod may be driven through the second protruding portions 43 to rotate relative to the base body 22. Similarly, when the right-side first pull rod rotates relative to the base body 22, the sliding block 4 may be driven to slide along the base body 22 through the second protruding portions 43, and then the left-side first pull rod is driven through the first protruding portions 42 to rotate relative to the base body 22, so that the synchronous movement of the left-side first pull rod and the right-side first pull rod is realized. Compared with a technical solution of using a gear set to realize synchronous movement in the related art, the thickness of the hinge assembly 100 may be reduced by reducing a shaft diameter of the first rotating portion 231 and a thickness of the sliding block 4, which is beneficial to the lightening and thinning of the hinge assembly 100.

The sliding connection between the base body 22 and the sliding block 4 may be realized in the following manner. The base body 22 may include a guide block 221, the sliding block 4 may include a second guide groove 41, and the guide block 221 may extend into the second guide groove 41, so that with matching of the guide block 221 and the second guide groove 41, when any first pull rod 23 rotates relative to the base body 22, the sliding block 4 may be driven to slide in the axial direction of the first rotating portion 231. In other examples, the base body 22 may also include a second guide groove 41, and the sliding block 4 may include a guide block 221, which is not limited in the disclosure. In order to improve the aesthetics of the hinge assembly 100, the base body 22 may include a support 222 and a cover body 223 assembled with the support 222, and the first rotating portion 231 may be rotationally connected with a shaft hole formed by assembling the support 222 and the cover body 223 in a matched mode, so as to reduce the assembling difficulty of the first pull rod 23, and the guide block 221 may be disposed between the cover body 223 and the support 222, so as to prevent the protrusion of the guide block 221 from interfering with other parts.

The fixed supporting pieces 1 may include a first fixed supporting piece located on the first side of the base body 22 and a second fixed supporting piece located on the second side when the hinge assembly 100 is in the unfolded state. The first fixed supporting piece may be rotationally connected with the left-side first pull rod, and the second fixed supporting piece may be rotationally connected with the right-side first pull rod. The first fixed supporting piece may be connected with a shell on one side of the electronic device, and the second fixed supporting piece may be connected with a shell on the other side of the electronic device, so that when the first fixed supporting piece and the second fixed supporting piece move relative to the base body 22, the shells on two sides of the electronic device may be driven to get close to each other or move away from each other, thereby realizing the folding and unfolding of the electronic device.

In the example, the hinge assembly 100 may include a plurality of locking mechanisms 3, one of the locking mechanisms 3 is disposed on the first fixed supporting piece. The locking mechanism 3 disposed on the first fixed supporting piece may be matched with the left-side first pull rod for limiting. One locking mechanism 3 is disposed on the second fixed supporting piece, and the locking mechanism 3 disposed on the second fixed supporting piece may be matched with the right-side first pull rod 23 for limiting, and through the simultaneous action of the plurality of locking mechanisms 3, the stability of the hinge assembly 100 in any state can be improved. The matching between the first fixed supporting piece and the left-side first pull rod may refer to the foregoing examples, and the matching between the second fixed supporting piece and the right-side first pull rod may also refer to the foregoing examples. In the example of the disclosure, the locking mechanisms 3 respectively disposed on the first fixed supporting piece and the second fixed supporting piece are taken as an example for illustration. In other examples, the locking mechanism 3 may also be disposed on any one of the first fixed supporting piece and the second fixed supporting piece, which is not limited in the disclosure.

Figure 13:
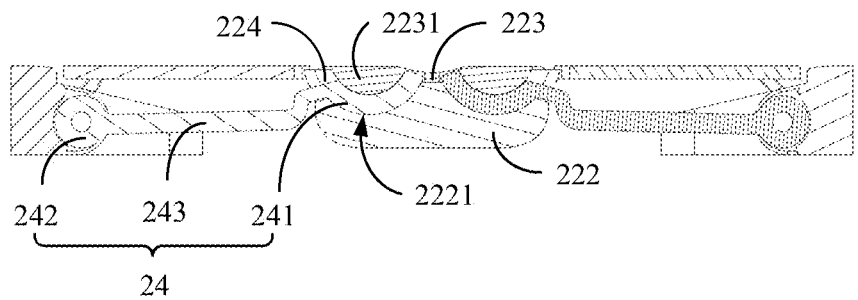
FIG. 13 is a second schematic cross-sectional diagram of a hinge assembly illustrated according to an embodiment of the disclosure.

As shown in FIG. 13, the second pull rod 24 may include a movable portion 241, a second rotating portion 242 and a second connecting portion 243, the second connecting portion 243 connects the movable portion 241 with the second rotating portion 242, the movable portion 241 is movably connected with the base body 22, and the second rotating portion 242 is rotationally connected with the fixed supporting piece 1. Based on this, when the movable portion 241 moves relative to the base body 22, the second rotating portion 242 may be pushed to move in a length direction of the second pull rod 24, and the second rotating portion 242 may drive the fixed supporting piece 1 to rotate relative to the base body 22 and push the fixed supporting piece 1 to get close to or move away from the base body 22. Therefore, in the case where the fixed supporting pieces 1 are disposed on both sides of the base body 22, the first side of the base body 22 is a left side in FIG. 13, and the second side of the base body 22 is a right side in FIG. 14, then the rotating assembly 2 may include a left-side second pull rod and a right-side second pull rod. One end of the left-side second pull rod may be movably connected with the base body 22, and the other end may be rotationally connected with the first fixed supporting piece. One end of the right-side second pull rod may be movably connected with the base body 22, and the other end may be rotationally connected with the second fixed supporting piece, so that the first fixed supporting piece is pushed to move through the left-side second pull rod, and the second fixed supporting piece is pushed to move through the right-side second pull rod. When the hinge assembly 100 is switched from the folded state to the unfolded state, both the first fixed supporting piece and the second fixed supporting piece may move close to the base body 22, and the first fixed supporting piece and the second fixed supporting piece may get close to each other at a back surface of the base body 22 so as to shield the base body 22, so that the back surface of the hinge assembly 100 is flat and the aesthetics is improved. When the hinge assembly 100 is switched from the unfolded state to the folded state, both the first fixed supporting piece and the second fixed supporting piece may move away from the base body 22 until the folded state shown in FIG. 4, so that the first fixed supporting piece and the second fixed supporting piece are prevented from interfering with flexible screens.

For the movable connection between the movable portion 241 and the base body 22, specifically, the base body 22 may include a first arc-shaped track 224, the movable portion 241 may include an arc-shaped movable portion, such as a semicircular arc-shaped movable portion, and the arc-shaped movable portion extends from an end portion into the first arc-shaped track 224 to be matched with the first arc-shaped track 224. Based on this, when the arc-shaped movable portion moves in the first arc-shaped track 224, on the one hand, the relative rotation of the second pull rod 24 and the base body 22 may be realized, and at the same time, position change between the arc-shaped movable portion and the first arc-shaped track 224 makes the second rotating portion 242 move away from or get close to the base body 22, thereby driving the fixed supporting piece 1 to move away from or get close to the base body 22.

In order to facilitate the installation, the support 222 of the base body 22 may include a first arc-shaped concave portion 2221, and the cover body 223 of the base body 22 may include a first arc-shaped convex portion 2231, for example, the first arc-shaped concave portion 2221 may be disposed in a semicircular shape, and the first arc-shaped convex portion 2231 may also be disposed in a semicircular shape, but a radius of the first arc-shaped convex portion 2231 is smaller than a radius of the first arc-shaped concave portion 2221, so that when the first arc-shaped convex portion 2231 is matched with the first arc-shaped concave portion 2221, the first arc-shaped track 224 may be formed due to the difference in radius. The first arc-shaped convex portion 2231 and the first arc-shaped concave portion 2221 disposed in the semicircular shape are taken as an example for illustration, in other examples, other forming modes may also be included as long as displacement change may be generated while the movable portion 241 rotates relative to the first arc-shaped track 224.

Figure 14:
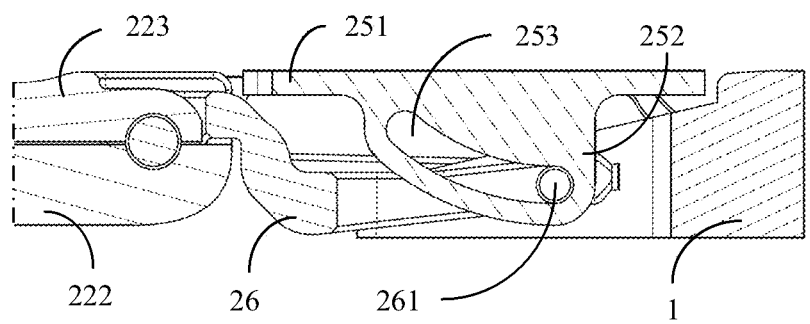
FIG. 14 is a third schematic cross-sectional diagram of a hinge assembly illustrated according to an embodiment of the disclosure.
Figure 15:
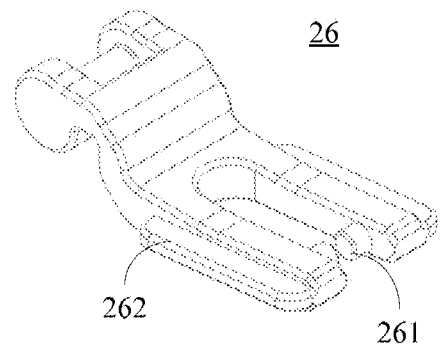
FIG. 15 is a schematic structural diagram of a third pull rod illustrated according to an embodiment of the disclosure.

In each of the above-mentioned examples, as shown in FIG. 14 and FIG. 15, the rotating assembly 2 may also include a screen supporting piece 25 and a third pull rod 26, the screen supporting piece 25 and the fixed supporting piece 1 may be disposed in a stacked mode. The screen supporting piece 25 includes a plate-shaped body 251, a second extending portion 252 extending from the plate-shaped body 251, and an inclined sliding groove 253 disposed on the second extending portion 252. One end of the third pull rod 26 is rotationally connected with the base body 22, the other end is slidably connected with the fixed supporting piece 1, the third pull rod 26 includes a third protruding portion 261, and the third protruding portion 261 may extend into the inclined sliding groove 253. Based on this, when the third pull rod 26 rotates relative to the base body 22, the third protruding portion 261 slides in the inclined sliding groove 253 and push the screen supporting piece 25 to rotate relative to the base body 22. Therefore, when the hinge assembly 100 is in the folded state, one flexible screen of the electronic device with the hinge assembly 100 may be supported by the screen supporting piece, so that the deformation of the flexible screen is reduced. For example, as shown in FIG. 15, a second guide rail 262 may be disposed at one end of the third pull rod 26 close to the fixed supporting piece 1, a second sliding groove may be disposed in the fixed supporting piece 1, and sliding connection between the third pull rod 26 and the fixed supporting piece 1 is realized through the cooperation of the second sliding groove and the second guide rail 262.

In order to guide and limit the movement of the screen supporting piece 25 relative to the base body 22, as shown in FIG. 3, the hinge assembly 100 may also include a supporting plate cover body 5. The supporting plate cover body 5 may include a second arc-shaped convex portion 51, the fixed supporting piece 1 may include a second arc-shaped concave portion 17, the second arc-shaped concave portion 17 is located at an edge of one side of the fixed supporting piece 1 away from the first pull rod 23. The second arc-shaped convex portion 51 of the supporting plate cover body 5 may be disposed in the second arc-shaped concave portion 17 to be matched with the second arc-shaped concave portion 17 to form a second arc-shaped track. The screen supporting piece 25 may include an arc-shaped guide piece 254 disposed on an edge of the plate-shaped body 251. The plate-shaped body 251 and the fixed supporting piece 1 are disposed in a stacked mode, and the arc-shaped guide piece 254 is matched with the second arc-shaped track. Based on this, in the movement process of the fixed supporting piece 1 relative to the base body 22, the screen supporting piece 25 may move adaptively to avoid being stuck.

The second arc-shaped convex portion 51 may be disposed in a semicircular shape, a cross section of the second arc-shaped concave portion 17 may be disposed in a semicircular shape, and a radius of the second arc-shaped convex portion 51 may be smaller than a radius of the second arc-shaped concave portion 17, so that when the second arc-shaped convex portion 51 is located in the second arc-shaped concave portion 17, the second arc-shaped track may be formed. The arc-shaped guide piece 254 of the screen supporting piece 25 may be an arc-shaped plate with a semicircular cross section. The second arc-shaped track and the arc-shaped guide piece 254 which are both semicircular are taken as an example for illustration. In other examples, the second arc-shaped track and the arc-shaped guide piece 254 may also be disposed in other arc shapes, which is not limited in the disclosure.

In the above-mentioned example, the third pull rod 26 pushes the screen supporting piece 25 to move, and it may be avoided that a structure is disposed on the first pull rods 23 to push the screen supporting piece 25, so that the problems of the complex stress and limited space on the first pull rods 23 can be solved. In other examples, the screen supporting piece 25 may also be pushed to move through the first pull rods 23. Specific implementations may refer to the matching between the third pull rod 26 and the screen supporting piece 25, and compared with a solution in which the third pull rod 26 is adopted to push the screen supporting piece 25, the structure of the hinge assembly 100 can be simplified. In the example provided by the disclosure, in order to adapt to application objects of the first fixed supporting piece, the second fixed supporting piece and the hinge assembly 100. The rotating assembly 2 may include a plurality of screen supporting pieces 25 and a plurality of third pull rods 26, one screen supporting piece 25 and the first fixed supporting piece are disposed in a matched mode, one end of one third pull rod 26 is rotationally connected with the base body 22, and the other end of the third pull rod 26 is slidably connected with the first fixed supporting piece. One screen supporting piece 25 and the second fixed supporting piece are disposed in a matched mode, one end of one third pull rod 26 is rotationally connected with the base body 22, and the other end of the third pull rod 26 is slidably connected with the second fixed supporting piece.

In the example provided by the disclosure, a thickness of the fixed supporting pieces 1 increases incrementally from one side close to the base body 22 to one side away from the base body 22. That is, a thickness of the fixed supporting piece 1 on the right side in FIG. 11 increases incrementally in a direction from left to right, and a thickness of the fixed supporting piece 1 on the left side increases incrementally in the direction from right to left. Therefore, as shown in FIG. 10, when the hinge assembly 100 is switched in the folded state, a bending radius of the bent portion 324 of the flexible screen is the largest, and the flexible screen away from the bent portion 324 is disposed oppositely, so that by incrementally increasing the thicknesses of the fixed supporting pieces 1, regions with the smaller thickness of the fixed supporting pieces 1 are closer to the bent region of the flexible screen than regions with the larger thickness, so as to adapt to the shape change of the flexible screen from the unfolded state to the folded state, and squeezing of the flexible screen by the fixed supporting pieces 1 is avoided.

Figure 16:
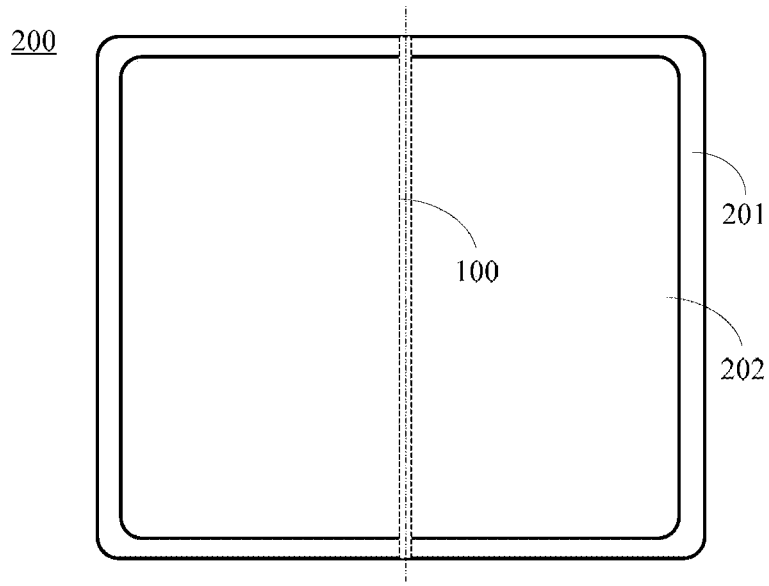
FIG. 16 is a schematic block diagram of an electronic device in an unfolded state illustrated according to an embodiment of the disclosure.
Figure 17:
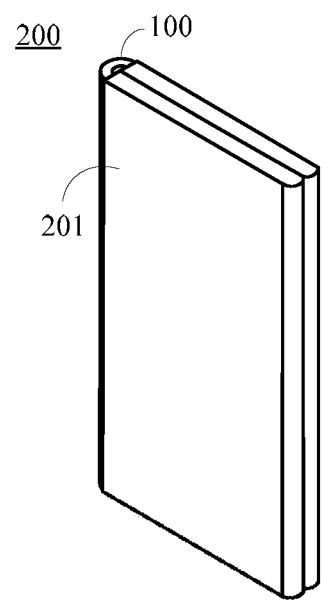
FIG. 17 is a schematic block diagram of the electronic device in FIG. 16 in a folded state.
Figure 18:
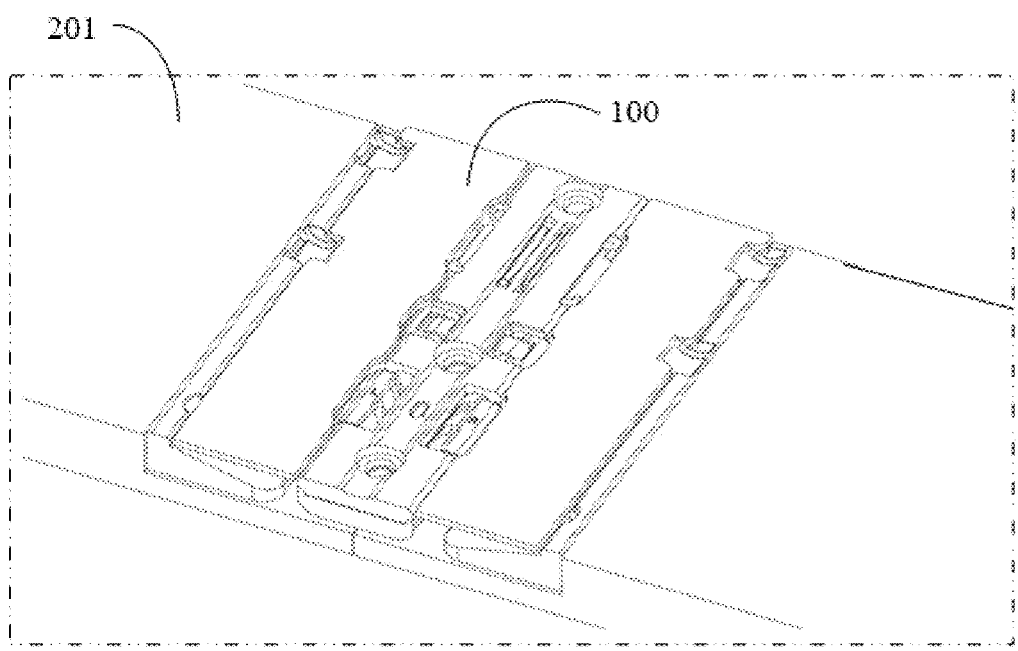
FIG. 18 is a schematic diagram of matching of a shell and a hinge assembly illustrated according to an embodiment of the disclosure.

Based on the technical solution of the disclosure, as shown in FIG. 16-FIG. 18, the disclosure also provides an electronic device 200. The electronic device 200 may include a shell 201, flexible screens 202 and a hinge assembly 100. The flexible screens 202 may be laid flat on the shell 201, one end of a rotating assembly 2 of the hinge assembly 100 away from first rotating portions 231 is configured to be connected to the shell 201, for example, first rotating portions 231 may be connected to the shell 201 through fixed supporting pieces 1, so as to drive the shell 201 to rotate, and the switching of the electronic device 200 between an unfolded state shown in FIG. 13 and a folded state shown in FIG. 14 is realized.

Specifically, the shell 201 may include a left shell and a right shell, the flexible screens 202 are laid flat on the left shell and the right shell, the left shell may be connected with the fixed supporting piece 1 on one side of the hinge assembly 100, and the right shell may be connected with the fixed supporting piece 1 on the other side of the hinge assembly 100. Based on this, when the hinge assembly 100 is bent, the two fixed supporting pieces 1 of the hinge assembly 100 will get close to or move away from each other, so that the left shell and the right shell are driven to get close to or move away from each other, and the flexible screens 202 are synchronously bent or unfolded.

Other implementation solutions of the disclosure will be apparent to those skilled in the art from consideration of the specification and practice of the disclosure herein. The disclosure is intended to cover any variations, uses, or adaptations of the disclosure following the general principles thereof and including such departures from the disclosure as come within known or customary practice in the art. It is intended that the specification and examples be considered as exemplary only, with a true scope and spirit of the disclosure being indicated by the following claims.

It will be appreciated that the disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A hinge assembly, comprising:
    a fixed supporting piece;
    a rotating assembly, movably connected with the fixed supporting piece and comprising a first limiting portion; and
    a locking mechanism, the locking mechanism is on the fixed supporting piece and comprising a limiting piece which comprises a second limiting portion matched with the first limiting portion, and
    wherein the fixed supporting piece slides relative to the rotating assembly in a direction perpendicular to an axial direction of the rotating assembly in a rotation process of the rotating assembly, so that the first limiting portion is connected with the second limiting portion or the first limiting portion is separated from the second limiting portion,
    when the first limiting portion is connected with the second limiting portion, the first limiting portion and the second limiting portion are matched with each other to limit rotation of the rotating assembly, and
    when the first limiting portion is separated from the second limiting portion, limiting of the rotating assembly is released;
    wherein the rotating assembly comprises:
    a base body;
    a first pull rod, wherein one end of the first pull rod is rotationally connected with the base body, an other end of the first pull rod is slidably connected with the fixed supporting piece, and the first limiting portion is located at an end of the first pull rod away from the base body; and
    a second pull rod, wherein one end of the second pull rod is movably connected with the base body, and an other end of the second pull rod is rotationally connected with the fixed supporting piece;
    wherein when the second pull rod moves relative to the base body, the fixed supporting piece is driven to rotate relative to the base body, and get close to or move away from the base body, and the fixed supporting piece and the first pull rod slide relatively so as to switch a relative position relation between the first limiting portion and the second limiting portion.

2. The hinge assembly according to claim 1, wherein the locking mechanism comprises an elastic piece,
    one end of the elastic piece is connected with or abuts against the fixed supporting piece,
    an other end of the elastic piece is connected with the limiting piece, and
    a deformation direction of the elastic piece is parallel with the axial direction of the rotating assembly.

3. The hinge assembly according to claim 2, wherein the fixed supporting piece comprises an accommodating groove and a first rotating shaft located in the accommodating groove;
    the elastic piece comprises a first elastic arm, a second elastic arm and a first connecting portion connecting the first elastic arm with the second elastic arm, the first connecting portion is around the first rotating shaft, the first elastic arm is connected with the limiting piece, and an elastic gap is between the first elastic arm and the second elastic arm; and
    the second limiting portion protrudes through a first inner wall of the accommodating groove, and the second elastic arm abuts against a second inner wall of the accommodating groove opposite to the first inner wall.

4. The hinge assembly according to claim 3, wherein a bent portion which is at least one of a first connection position between the first elastic arm and the first connecting portion and a second connection position between the second elastic arm and the first connecting portion; and one end of the second elastic arm away from the first connecting portion is bent toward the second inner wall to abut against the second inner wall.

5. The hinge assembly according to claim 1,
wherein one of the first limiting portion and the second limiting portion comprises at least one convex block disposed side by side in the direction perpendicular to the axial direction of the rotating assembly, and the other one comprises at least one concave portion,
wherein the same convex block is configured to be matched with different concave portions, so as to limit the first limiting portion at different angles; and
wherein the fixed supporting piece slides in the direction perpendicular to the axial direction of the rotating assembly in the rotation process of the rotating assembly, so that when the convex block is at least partially located in the concave portion, rotation of the rotating assembly is limited, and when the convex block is separated from the concave portion, limiting is released.

6. The hinge assembly according to claim 1, wherein
the first pull rod comprises a first rotating portion and a first matching portion connected with the first rotating portion,
the first rotating portion is rotationally connected with the base body,
the first matching portion is slidably connected with the fixed supporting piece, and
the first limiting portion is on the first matching portion.

7. The hinge assembly according to claim 6, wherein one of the first matching portion and the fixed supporting piece comprises a first sliding groove, and the other one comprises a first sliding rail.

8. The hinge assembly according to claim 6, wherein
the first matching portion comprises a first subsection and a second subsection which are respectively connected with the first rotating portion and disposed at an interval in an axial direction of the first rotating portion,
the fixed supporting piece comprises a first concave groove, a second concave groove, and a first extending portion located between the first concave groove and the second concave groove,
the first subsection is in the first concave groove and slidably connected with an inner wall of the first concave groove, and
the second subsection is in the second concave groove and slidably connected with an inner wall of the second concave groove.

9. The hinge assembly according to claim 8, wherein
the first limiting portion is in the first subsection,
the fixed supporting piece comprises an accommodating groove
the accommodating groove communicates with the first concave groove, and
the locking mechanism is in the accommodating groove.

10. The hinge assembly according to claim 6, wherein the rotating assembly comprises a plurality of first pull rods, a first pull rod is rotationally connected with the base body and comprises the first rotating portion and the first matching portion respectively, the first rotating portion comprises a first guide groove extending obliquely around an axial direction of the first rotating portion, wherein at least one first pull rod is located on a first side of the base body, at least one first pull rod is located on a second side of the base body, and the first side and the second side are oppositely disposed; and
the rotating assembly further comprises a sliding block, the sliding block comprises a first protruding portion and a second protruding portion which are on two opposite surfaces, the first protruding portion extends into the first guide groove of the first pull rod located on the first side of the base body, the second protruding portion extends into the first guide groove of the first pull rod on the second side of the base body, and when any one of the first pull rods rotates relative to the base body, the sliding block is driven to slide so that the other one rotates relative to the base body.

11. The hinge assembly according to claim 10, wherein one of the base body and the sliding block comprises a guide block, and the other one comprises a second guide groove matched with the guide block.

12. The hinge assembly according to claim 11, wherein the fixed supporting piece comprises a first fixed supporting piece and a second fixed supporting piece, the first fixed supporting piece is slidably connected with the first pull rod located on the first side of the base body, and the second fixed supporting piece is slidably connected with the first pull rod located on the second side of the base body; and
wherein the locking mechanism is on the first fixed supporting piece and/or the second fixed supporting piece, the locking mechanism on the first fixed supporting piece is matched with the first pull rod located on the first side of the base body for limiting, and the locking mechanism on the second fixed supporting piece is matched with the first pull rod located on the second side of the base body for limiting.

13. The hinge assembly according to claim 1, wherein
the second pull rod comprises a movable portion, a second rotating portion and a second connecting portion,
the second connecting portion connects the movable portion with the second rotating portion,
the movable portion is movably connected with the base body, and
the second rotating portion is rotationally connected with the fixed supporting piece.

14. The hinge assembly according to claim 13, wherein
the base body comprises a first arc-shaped track,
the movable portion comprises an arc-shaped movable portion,
the arc-shaped movable portion extends into the first arc-shaped track, and
when the movable portion moves along the first arc-shaped track, the fixed supporting piece gradually moves away from or gets close to the base body, and a first matching portion slides relative to the fixed supporting piece.

15. The hinge assembly according to claim 14, wherein the base body comprises a support and a cover body, the support comprises a first arc-shaped concave portion, the cover body comprises a first arc-shaped convex portion, and the first arc-shaped convex portion is in the first arc-shaped concave portion to form the first arc-shaped track in a matched mode.

16. The hinge assembly according to claim 1, wherein the rotating assembly further comprises:
a screen supporting piece, wherein the screen supporting piece and the fixed supporting piece are disposed in a stacked mode, and the screen supporting piece comprises a plate-shaped body, a second extending portion extending from the plate-shaped body, and an inclined sliding groove on the second extending portion; and a third pull rod, wherein one end of the third pull rod is rotationally connected with the base body, an other end of the third pull rod is slidably connected with the fixed supporting piece, the third pull rod comprises a third protruding portion, the third protruding portion extends into the inclined sliding groove, and when the third pull rod rotates relative to the base body, the third protruding portion slides in the inclined sliding groove and pushes the screen supporting piece to rotate relative to the base body.

17. The hinge assembly according to claim 16, wherein the hinge assembly further comprises a supporting plate cover body, the fixed supporting piece comprises a second arc-shaped concave portion, the second arc-shaped concave portion is located at an edge of the fixed supporting piece away from the first pull rod, the supporting plate cover body comprises a second arc-shaped convex portion, and the second arc-shaped convex portion is in the second arc-shaped concave portion to form a second arc-shaped track in a matched mode; and the screen supporting piece comprises an arc-shaped guide piece on an edge of the plate-shaped body, the plate-shaped body and the fixed supporting piece are in a stacked mode, and the arc-shaped guide piece is matched with the second arc-shaped track.

18. The hinge assembly according to claim 1, wherein a thickness of the fixed supporting piece increases incrementally from one end close to the rotating assembly to one end away from the rotating assembly.

19. An electronic device, comprising:

a shell; and a hinge assembly, comprising:

a fixed supporting piece;

a rotating assembly, movably connected with the fixed supporting piece and comprising a first limiting portion; and a locking mechanism, the locking mechanism is on the fixed supporting piece and comprising a limiting piece which comprises a second limiting portion matched with the first limiting portion;

wherein the fixed supporting piece slides relative to the rotating assembly in a direction perpendicular to an axial direction of the rotating assembly in a rotation process of the rotating assembly, so that the first limiting portion is connected with the second limiting portion or the first limiting portion is separated from the second limiting portion; when the first limiting portion is connected with the second limiting portion, the first limiting portion and the second limiting portion are matched with each other to limit rotation of the rotating assembly; and when the first limiting portion is separated from the second limiting portion, limiting of the rotating assembly is released;

the fixed supporting piece is connected to the shell so as to drive the shell to rotate.

\* \* \* \* \*